United States Patent [19]

Fenster et al.

[11] Patent Number: 4,694,339
[45] Date of Patent: Sep. 15, 1987

[54] POWER LINE LOCKED IMAGE PROCESSING SYSTEMS

[75] Inventors: Paul Fenster, Petach Tikvah; Zeev Ganor, Herzelia, both of Israel

[73] Assignee: Elscint Ltd., Haifa, Israel

[21] Appl. No.: 614,805

[22] Filed: May 29, 1984

[51] Int. Cl.⁴ .......................... H04N 5/04; H03L 7/00
[52] U.S. Cl. .................................... 358/148; 358/111; 358/158; 331/20; 331/21; 378/99; 378/113
[58] Field of Search ............... 358/148, 149, 150, 151, 358/158, 111; 331/20, 21; 378/99, 113

[56] References Cited
U.S. PATENT DOCUMENTS
4,468,698 8/1984 Kavoussi et al. .................. 358/148

Primary Examiner—James J. Groody
Assistant Examiner—Michael D. Parker
Attorney, Agent, or Firm—Sandler & Greenblum

[57] ABSTRACT

A line locking system for use with X-ray video imaging equipment comprising: a system oscillator, a divider for frequency dividing the output of the system oscillator to obtain a signal having a frequency that is an integer multiple of the line frequency, a comparator for comparing the phase of the integer multiple signal to the phase of the line signal and means for controlling the oscillator frequency responsive to the output of the comparator.

14 Claims, 4 Drawing Figures ment. When equipment is designed to lock in at the 50 HZ
POWER LINE LOCKED IMAGE PROCESSING SYSTEMS

FIELD OF THE INVENTION

This invention is concerned with imaging systems and, more particularly, with systems which generate video images based on acquired data.

BACKGROUND OF THE INVENTION

It is now well known to use acquired data for generating images on a video screen within imaging systems. Such generated images are used in fields as diverse as astronomy, aerial surveying, aerial surveillance, and medical diagnostics. An advantage of generating images from acquired data is that it is much easier to process the data to enhance such images than when photographs are taken directly or when video cameras are used to directly project the images onto a TV screen.

Imaging systems using acquired data generally are comprised of four major sections. First, there is the data acquisition section. For example, in digital fluorography, the acquisition section of the system comprises an X-Ray tube, the detector and an image intensifier along with a video camera for converting the intensified, detected image to electrical signals.

Following the acquisition section of the system is an image processing section, where a good deal of the enhancement is accomplished and which directs the electrical signals to an image memory where they are stored on an element by element basis that corresponds or can be made to correspond to the pixel designation of the actual displayed image. The image processing section also includes a timing generator for generating the timing signals required for displaying the data as an enhanced video image.

In addition to the image processor section, there is the multi-processor section which is the main control section and includes central memory means and the main processor sub-sections. Finally, there is the display section where the processed data generated image is displayed.

In general, when utilizing video signals and displays, an attempt is made to lock the system's generated signals to the power line frequency signals. It is desirable to line lock image processing systems in order to stabilize the image display, to avoid frequency jitter and to reduce the adverse effect of hum noises.

Another reason for the line locking is applicable when the imaging system acquires data using X-Ray equipment. When the X-Ray tubes are operated on a pulse basis, they are generally locked to the line. For a general synchronization of the system, it is extremely desirable to line lock image processing systems, especially when the acquisition portion operates with X-Ray equipment.

There are, in general, two different power line frequencies used in the world. In the United States, for example, 60 Hertz frequency is standard; whereas, in Europe and the Middle Eastern countries, 50 Hertz is standard. This duality of line frequencies raises problems because modern day manufacturers manufacture for the world at large. Thus, the manufacturers of image processing equipment have to take into account this distinction in line frequencies. The imaging processing equipment, as presently available, is designed to lock into either a 50 Hz frequency or a 60 Hz frequency. When equipment is designed to lock in at the 50 HZ frequency, then the basic frequency of the processing system is some product of 50 HZ per second; whereas, when the system is designed to lock in at the 60 HZ frequency, then the basic frequency of the system is some product of 60 HZ.

There is a distinct advantage to having the system operate at the basic 50 Hz rate. When the system is operating at a basic 50 Hz rate then the basic time unit of the system is 20 milliseconds, when the system is operating at a basic 60 Hz rate, then the basic time unit is 16.6 milliseconds. Thus, with the 50 Hz system, if all other things are equal, there is more time for the software or dedicated hardware systems to operate and fulfill their functions. The difference of 3.4 milliseconds seems small at first, but that time period has to be viewed in the proper perspective. When operations occur in the nanosecond range, 3.4 milliseconds is a long time. For example, standard 50 Hz systems display a full $512 \times 512$ matrix and use the additional lines for alphanumeric information.

Accordingly, it is an object of the present invention to provide image processing systems, that operate at a basic low frequency rate, regardless of whether the line frequency is 50 Hz or 60 Hz.

BRIEF DESCRIPTION OF THE INVENTION

According to the present invention, power line powered image processing systems that convert acquired data to images on video display devices are provided; said systems comprising:

main system oscillator means for providing the frequencies required for the image processing.

locking means for locking said processing systems to the line frequency of said power lines, and said locking means including means for enabling the operation of said processing systems at a frequency different from a frequency which is an integral product of the line frequency and nonetheless locking said systems to said line frequency.

A related object of the present invention comprises using comparator means for comparing the frequency signal from said main oscillator means to said line frequency, and means responsive to differences determined by said comparator means for varying said frequency output of said main oscillator means to lock said oscillator to said line frequency.

A related feature of the present invention is the use of phase comparator means and wherein the means responsive to the differences determined by said comparator means is feedback circuit means used to vary the frequency of the main oscillator means until the zero crossover point of the frequency of said main oscillator and said line frequency coincide, thereby locking the frequency of the main oscillator to said line frequency.

A still further related feature of the present invention varies the frequency of the main oscillator means until the zero crossover point of the line frequency (50 or 60 Hz) coincides with a trigger pulse. This trigger pulse is a delayed vertical pulse (50 Hz) obtained by dividing the nominal main oscillator frequency (25 Mhz) by a divisor (500,000) and delaying the quotient by T.

BRIEF DESCRIPTION OF THE DRAWINGS

The above mentioned and other features and objects of the present invention will be better understood when considered in the light of the following description of a broad aspect of the present invention, taken in conjunction with the accompanying drawings, wherein.

GENERAL DESCRIPTION

Figure 1:
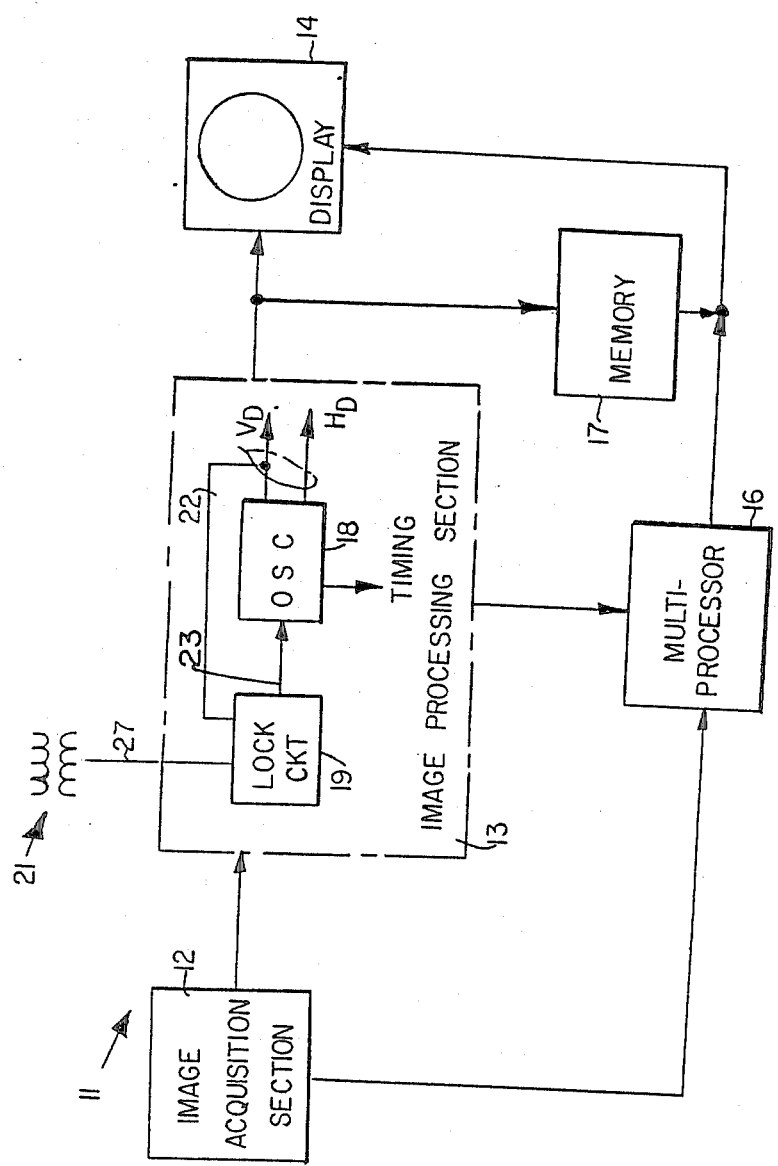
FIG. 1 is a block diagram depiction of an imaging system.

The image processing system 11 of FIG. 1 comprises an acquisition section 12, an image processing section 13, a display section 14 and a central multiprocessor section 16. The central processor 16 is connected to the other sections in the usual manner indicated merely by unnumbered lines. It controls the overall operation of the other sections of the system. There is also shown a display memory 17, which usually is considered part of the image processing section.

The image processing section 13 is shown as including a main oscillator 18. The output of the main oscillator provides timing signals and the vertical and horizontal drive for the CRT video display. Connected at the input of oscillator 18 is a line locking circuit 19. The inputs to the line locking circuit are the power frequency connected through a line transformer 21 and feedback signals from the output of the oscillator 18 connected through conductor 22. The output of the line locking circuit 19 is connected to the oscillator 18 through conductor 23.

Figure 2:
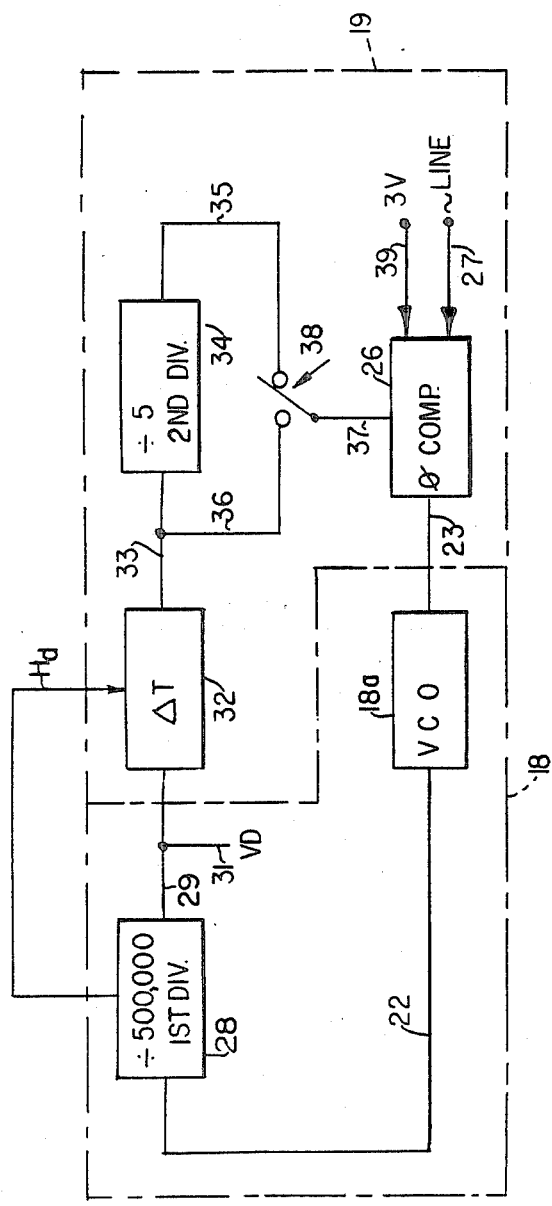
FIG. 2 is a block diagram of exemplary locking means for locking the frequency of the main oscillator to the line frequency.

FIG. 2 shows, in block diagram form, more details of the line locking circuits of FIG. 1. In general, what the line locking circuits accomplishes is to enable the image processing system to operate at a low frequency, 50 Hz, in this example, and lock to line frequencies of the same frequency or greater, i.e. 50 or 60 Hz. More particularly, in FIG. 2, the central oscillator 18 is shown as a voltage controlled oscillator 18a. It should be understood that within the scope of the invention, the method of controlling the oscillator is unimportant. It is important that oscillator output is controlled by a relationship between the oscillator frequency output and the line frequency, so that the oscillator frequency output can be locked to the line frequency. In the embodiment described herein, a phase comparator 26 is used to compare the line frequency connected at 27 and a processed output of the oscillator 18 connected at 37. The output of the oscillator 18 is processed by dividing the output frequency of the oscillator by 500,000 in unit 28. In the embodiment described, the output frequency of oscillator 18 is nominally 25 MHz, therefore when dividing by 500,000, the result is an output frequency of 50 Hz on conductor 29. The 50 Hz output on conductor 29 is in the form of pulses with a nominal 20 millisecond interval. These, incidentally, are also used as the vertical drive pulses (VD) for the system as indicated by line 31.

As an additional feature of this invention, means are provided for varying the time period between the vertical drive pulses and the tigger pulses. Thus, the vertical drive can be controlled by commence at anytime during the line frequency cycle. This is advantageous when, noise is especially prevalent at a certain location, such as at a point midway on the rising portion of the line sine wave. By controlling the drive pulse, to not occur at this same point i.e. be zero at the point of noise, the noise is automatically reduced and the signal-noise ratio is improved. The means for doing this is shown as a delta T or phase shifting unit 32 which shifts the phase of the output or delayed vertical drive pulse relative to the vertical drive pulse by varying the time between the output or delayed vertical drive pulse and the input vertical drive pulse.

Line locking means are provided for enabling the main oscillator to lock onto a line frequency even when the line frequency does not provide an integral quotient when divided into the oscillator frequency. More particularly, the line locking means provides a trigger pulse (selectively either the delayed vertical drive pulse or a divided vertical drive pulse) sequence having a frequency that either coincides with the line frequency or is less than the line frequency. When the trigger pulse frequency is less than the line frequency then the trigger pulse frequency is divided by a number to provide pulses at line frequency cross over points. For example, when the oscillator frequency is 25 MHz and the line frequency is 60 Hz, the oscillator frequency is divided by 500,00 in order to obtain the 50 Hz used as the vertical sync pulse and as the trigger pulse. This quotient (50 Hz) is divided by 5 since the 60 Hz period coincides with the 50 Hz period every fifth period of the 50 Hz signal.

Thus, when the line frequency is 60 Hz the divide-by-five circuit 34 is used. When the line frequency is 50 Hz then the divide by 5 circuit 34 is bypassed by conductor 36 and switch 38. Conductor 35 at the output of divide circuit 34 is tied to conductor 37 by switch 38 only when the frequency is 60 Hz.

The phase comparator unit 26 in a preferred embodiment compares the phase of the trigger pulses on conductor 37 with the line frequency. If there is no phase difference i.e., if the trigger pulse occurs during the zero crossover point of the line frequency, then the output of the comparator 26 on conductor 23 is the fixed voltage, such as three (3) volts, that is connected to the phase comparator at input 39. Conductor 23 brings the fixed voltage to the input of the voltage controlled oscillator 18 to cause the voltage controlled oscillator to generate a 25 MHz output. If there is a positive phase difference between the signal on conductor 37 and the line frequency on conductor 27, then the voltage output of unit 26 is reduced. If there is a negative phase difference between the phase of the trigger signal and the line frequency, then the comparator voltage output is increased. Increased input voltage to the VCO increases the output frequency. The variations in frequency continue until the change in frequency causes the trigger voltage and the zero crossover of the line frequency to occur simultaneously so that no phase difference is detected by the phase comparator. With no phase difference, the fixed voltage (e.g. 34) is applied to the VCD to obtain the 25 MHz output.

Figure 3:
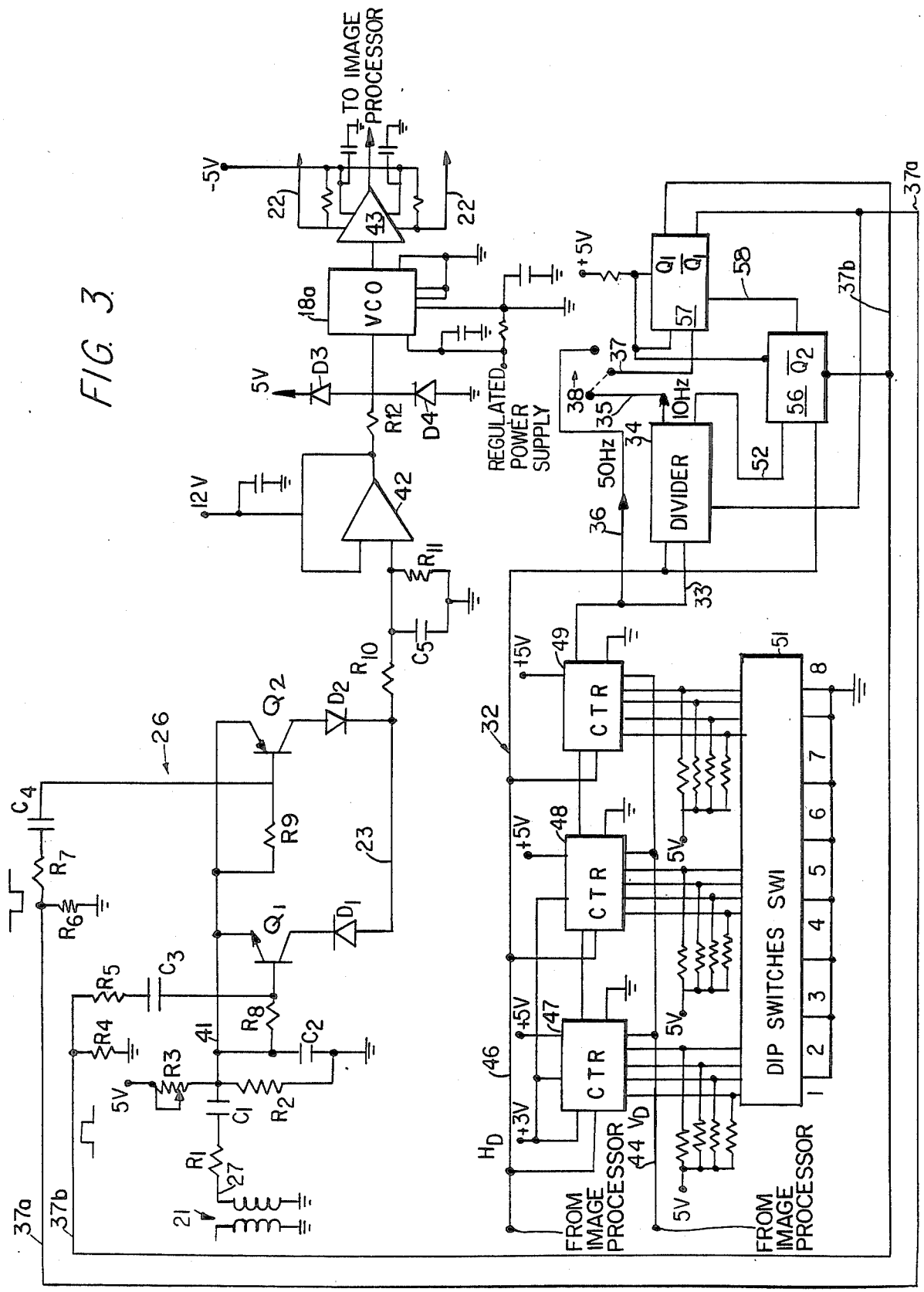
FIG. 3 is a schematic showing of the locking means of FIG. 2.

Details of the operation of the line locking circuitry are schematically shown in FIG. 3. In particular, the phase comparator is shown as comprising the transformer 21 for bringing the power line current into the line locking means 19. The line current is coupled to the phase comparator active elements through coupling resistor R1 in series with coupling capacitor C1 and conductor 41 connected to the emitters of transistors Q1 and Q2. Transistor Q1 is an NPN transistor, while transistor Q2 is a PNP transistor. The collectors of the transistors are connected to conductor 23 through oppositely going diodes D1 and D2. The bases of the transistors Q2 and Q1 are coupled to the trigger pulses through conductors 37a and 37b respectively. Conductor 37a has thereon the negative going trigger pulse. If the trigger pulses occur during the positive portion of the power line frequency, then transistor Q1 operates to conduct a positive signal to conductor 23. If the trigger pulses occur during the negative going portion of the power line frequency then transistor Q2 operates to connect a negative signal to conductor 23. Thus, unless the trigger pulses occur during the zero crossover of the power line frequency, there is an output from the phase comparator circuit 26.

Means are provided for assuring that there is voltage input to the VCO even when the line signal and the trigger pulse are in phase. More particularly, a voltage divider network comprising variable resistor R3, in series with R2, is coupled to ground, the junction point of R3 and R2 is coupled to conductor 41. The variable resistor R3 is adjusted in the example described herein to provide a positive three volts. Base biasing resistors R8 and R9 are shown coupled between the bases of the transistors Q1 and Q2 and conductor 41. Similarly, coupling and divider circuit elements are shown connected to conductors such as 37a, 37b, and the respective bases of transistor Q2 and Q1, for carrying the trigger pulses to operate the transistors. More particularly, conductor 37a is joined to the base of transistor Q2 through the series connection of resistor R7 and capacitor C4. The junction of conductor 37a and resistor R7 is grounded through divider resistor R6. Similarly, conductor 37b is coupled to the base of transistor Q1 through the series circuit comprising resistor R5 and capacitor C3. The junction of conductor 37b and resistor R5 is grounded through divider resistor R4.

A buffer amplifier 42 is shown joining conductor 23, the output of the phase comparator and the input of oscillator 18. More particularly, buffer amplifier 42 is shown between conductor 23 and the input to the oscillator 18. Coupling and filter circuitry is also shown between the conductor 23 and the input to the buffer amplifier 42. More particularly, resistor R10 is connected between conductor 23 and the input of the buffer amplifier. Resistor R11 and capacitor C5, parallel to resistor R11, are coupled between ground and the junction of resistor R10 and the buffer amplifier. The output of the buffer amplifier is connected to the input of the main oscillator 18 through resistor R12.

Means are provided for limiting the voltage input to the main oscillator. More particularly, diodes D3 and D4 are connected between five volts and ground. The junction of the diodes is coupled to the junction of resistor R12 and the input to the main oscillator. With five volts coupled to the cathode of diode D3 and ground coupled to the anode of doide D4, the voltage is limited between ground and five volts.

The output of oscillator 18a is directed through buffer amplifier 43 to circuits not shown in the image processor. These circuits define and provide the timing pulses required along with vertical and horizontal drive signals. The vertical drive signal is shown as being connected from image processor to conductor 44. The horizontal drive signal is also connected from the image processor 43 to conductor 46 of the line locking circuit 19 through conductor 46. Means are provided for varying the time between the vertical drive pulses and the trigger pulses directed to the comparator unit 26. More particularly, a delta T network 32 is shown as comprising a plurality of individual counters 47, 48 and 49, connected in series. The output count of the counters is determined by dipswitch circuitry 51. The operation of the dipswitch circuitry 51 controls the time length between the vertical drive pulse on conductor 44 and the trigger pulses coupled to the comparator. Note that the positive and negative trigger pulses occur simultaneously. Responsive to sequential vertical drive pulses, the counters are loaded under the direction of dipswitch circuit 51.

The horizontal drive pulses are counted until the count reaches the quantity set into the dipswitch for each sequential counter, then a trigger pulse appears on conductor 33 at the output of the counters 47, 48 and 49 in series. The output of the counter 49 appears on both conductors 33 and 36. If "chain" 38 is connected to conductor 36, then the counter output bypasses the divide-by-five circuit 34. The divide by 5 circuit 34 essentially performs the following two functions as shown in the schematic circuit of FIG. 3: (1) it counts every fifth pulse, thereby dividing by five; and (2) it counts the horizontal drive pulses on conductor 46. A first divide by five output appears on conductor 35. Another output is provided on conductor 52. This other output is the horizontal drive pulse divided by some number. In the preferred embodiment shown herein, each horizontal pulse is 64 microseconds in width and it is divided by 8 to obtain the output on conductor 52. This output is used to increase the width of the trigger pulses generated from the counter output appearing on conductor 35.

The means for increasing the width of the trigger pulses are a pair of flip-flop units 56 and 57. The input to these flip-flop units comprise the line frequency pulses received over conductor 37 and the horizontal pulse received over conductor 58 from conductor 46. More particularly, pulses received on conductor 37 are coupled to flip-flop unit 57 and cause a positive output from Q1 and a negative output from Q1 NOT. The pulse width is determined when the output of Q2 NOT of flip-flop 56 resets flip-flop circuit 57. A signal is received from Q2 NOT responsive to the activating signal on conductor 58 and enabled by the signal on conductor 52. The trigger pulse thus extends from the beginning of the vertical pulse to the time period at the end of eight horizontal pulses.

Flip-flop circuit 56 is reset by the output Q1 of flip-flop circuit 57. The horizontal counter is reset by the output of Q1 NOT of flip-flop 57.

In operation the system performs to lock the main system oscillator 18 to the line frequency, regardless of whether a 50 Hz line or a 60 Hz line is used and nonetheless operate at a basic frequency that is an integer and product of fifty. Means are also provided for varying the time between the vertical drive pulses and the trigger pulses.

Figure 4:
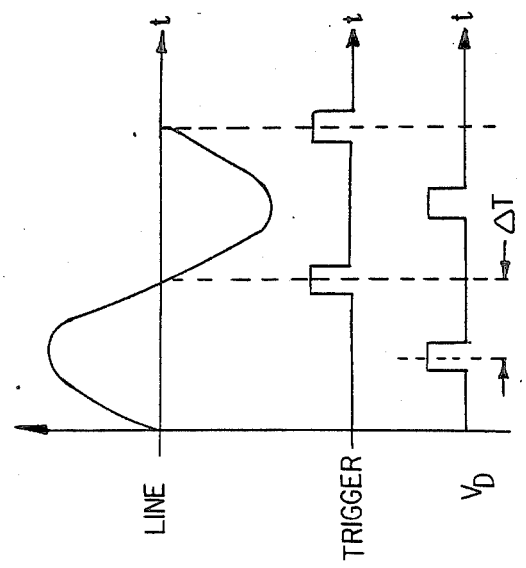
FIG. 4 is a timing diagram showing the relationship between the line frequency, the output of the main frequency oscillator and the vertical sync pulses used for generating the displayed video image.

The time difference delta T is shown in FIG. 4 wherein the trigger pulse is shown as being locked to the crossover of the line frequency sine wave and the vertical drive pulse is delta T distance before the trigger pulse.

The main oscillator 18 of the circuit is locked to the line frequency using a phase comparator circuit 26. The phase comparator circuit compares the phase of the power line sine wave and the phase of the trigger pulses generated from the output signal of the main frequency oscillator of the image processing system. More particularly, in the preferred embodiment shown and described herein, the main frequency oscillator is voltage controlled. The phase comparator provides the voltage for controlling the VCO. The output of the voltage controlled oscillator is 25 MHz. A divide by 500,000 circuit is provided to obtain the 50 Hz used for locking the system to the line frequency. A divide-by-five circuit is used when the line frequency is 60 Hz. This divide by five assures that the 50 Hz output signals are converted to 10 Hz. signals. The 10 Hz signals from this circuit align with the zero crossover of the line frequency at every sixth cycle when the line frequency is 60 cycles per second. Means are also provided for varying the time between the trigger pulse and the vertical pulse.

Accordingly, a new and advantageous image processing system is provided which can operate with line frequencies of 50 Hz or 60 Hz, and nonetheless maintain the system operation at a basic 50 Hz frequency.

While the system has been described with certain preferred embodiments and specific frequencies, it should be understood that this description of the circuitry and the naming of specific frequencies is made by way of example only and not as a limitation on the scope of the inventions.

What is claimed is:

1. An imaging system for processing acquired data to convert said acquired data to images on video display devices, said system obtaining power from a power line, said system comprising: system oscillator means for providing frequency signals, locking means for locking the frequency of the system oscillator means to the frequency of the power line, and said locking means including means for enabling said locking even when the system oscillator means frequency is other than an integer multiple of the power line frequency.

2. The system of claim 1 wherein said locking means includes means for comparing the power line frequency zero cross over points with the occurrences of output pulses of the system oscillator means, and means for varying the frequency of the output pulses of said system oscillator means in response to said comparison.

3. The system of claim 2 wherein first frequency divide means are provided to divide said system oscillator means output pulses to provide drive pulses having a drive pulse frequency, said drive pulse frequency being either equal to a multiple of said power line frequency or being greater than said power line frequency by a fractional amount.

4. The system of claim 3 wherein said locking means comprises second frequency divide means, means for connecting the output pulses of said first frequency divide means to said second frequency divide means, switch means for directing obtained pulses obtained from the output of either said first frequency divide means or said second frequency divide means to said comparing means.

5. The system of claim 4 wherein said comparing means comprises: gate means, and wherein said system oscillator means is a voltage controlled oscillator said gate means operated responsive to the zero crossover points of said power line frequency and said obtained pulses coinciding to apply a first voltage to said voltage controlled oscillator to maintain the nominal frequency of said voltage controlled oscillator; said obtained pulses occuring during the positive portion of said power line frequency to apply a second voltage to said voltage controlled oscillator to increase the frequency of said voltage controlled oscillator, and said obtained pulses occuring during the negative portion of said power line frequency to apply a third voltage to said voltage controlled oscillator to decrease the frequency of said voltage controlled oscillator.

6. The system of claim 4 wherein said power line frequency is either 60 Hz or 50 Hz.

7. The system of claim 6 wherein said voltage controlled oscillator frequency is 25 MHz, said first frequency divide means is for dividing said 25 MHz by 500,000, said second frequency divide means is for dividing the output of said first divide means by five, and means for selecting the output of either said first or said second frequency divide means for comparing to the power line frequency.

8. The system of claim 3 wherein pulse delay means are provided to derive delayed drive pulses by delaying the time of occurrence of said drive pulses, said delay being controllable to extend from zero to a complete line cycle.

9. The system of claim 8 wherein said means for varying the system oscillator means frequency comprises feed back circuit means for changing the output frequency of said system oscillator means responsive to differences between the crossover points of the power line frequency and the delayed drive pulses.

10. The system of claim 9 wherein second frequency divide means are provided for dividing said delayed drive pulses to provide divided drive pulses at the power line frequency zero crossover points when said drive pulse frequency is greater than said power line frequency by a fractional amount.

11. The system of claim 10 wherein said system oscillator means comprises a voltage controlled oscillator and wherein the voltage into said voltage controlled oscillator is varied as a function of said phase differences between the zero crossover points of said power line frequency and the occurrence of said drive pulses.

12. The system of claim 10 wherein said comparing means provides; a first voltage responsive to said drive pulse frequency being an integer sub-multiple of said power line frequency, a second voltage responsive to said drive pulse frequency being less than an integer sub-multiple of said power line frequency and a third voltage responsive to said drive pulse frequency being more than an integer sub-multiple of said line frequency, said first voltage maintaining the nominal frequency of said system oscillator means while said second and third voltages increase and the nominal frequency of said system oscillator means, respectively.

13. The system of claim 9 including means for detecting phase differences between said delayed drive pulses and the zero crossover points of said power line frequency.

14. The system of claim 1 wherein said image processing system is a digital fluorography system.

* * * * *